United States Patent
Chen et al.

(10) Patent No.: US 10,479,086 B2
(45) Date of Patent: Nov. 19, 2019

(54) PROCESS FOR MAKING A MOLDED DEVICE ASSEMBLY AND PRINTHEAD ASSEMBLY

(71) Applicant: HEWLETT-PACKARD DEVELOPMENT COMPANY, L.P., Houston, TX (US)

(72) Inventors: Chien-Hua Chen, Corvallis, OR (US); Thomas R Strand, Corvallis, OR (US); Michael G Groh, Corvallis, OR (US)

(73) Assignee: HEWLETT-PACKARD DEVELOPMENT COMPANY, L.P., Spring, TX (US)

( * ) Notice: Subject to any disclaimer, the term of this patent is extended or adjusted under 35 U.S.C. 154(b) by 0 days.

(21) Appl. No.: 16/112,966

(22) Filed: Aug. 27, 2018

(65) Prior Publication Data

US 2018/0361746 A1 Dec. 20, 2018

Related U.S. Application Data

(63) Continuation of application No. 15/308,562, filed as application No. PCT/US2014/037669 on May 12, (Continued)

(51) Int. Cl.
B41J 2/16 (2006.01)
B41J 2/14 (2006.01)
(Continued)

(52) U.S. Cl.
CPC ........... B41J 2/1637 (2013.01); B29C 69/001 (2013.01); B41J 2/1404 (2013.01);
(Continued)

(58) Field of Classification Search
CPC .. B41J 2/1637; B41J 2/14016; B41J 2/14145; B41J 2/14201; B41J 2/155; B41J 2/1645; B41J 2/1628; B41J 2/1607; B41J 2/1601; B41J 2/1433; B41J 2/162; B41J 2/1404; B41J 2/1632; B41J 2/1623; B41J 2/1603;
(Continued)

(56) References Cited

U.S. PATENT DOCUMENTS 8,556,611 B2 10/2013 Dolan et al.
2002/0180825 A1 12/2002 Buswell et al.
(Continued)

FOREIGN PATENT DOCUMENTS

CN 102470672 A 5/2012
JP 2000108360 4/2000
(Continued)

OTHER PUBLICATIONS

IP.com search (Year: 2019).*
Handling Guide for Thermal Print Head, (Research Paper), Feb. 12, 2008.

*Primary Examiner* — Lisa Solomon
(74) *Attorney, Agent, or Firm* — HP Inc. Patent Department (57) ABSTRACT

In one example, a process for making a micro device assembly includes placing a micro device on a front part of a printed circuit board, molding a molding on the printed circuit board surrounding the micro device, and then forming a channel to the micro device in a back part of the printed circuit board.

16 Claims, 12 Drawing Sheets

Related U.S. Application Data 2014, now Pat. No. 10,232,621, which is a continuation-in-part of application No. PCT/US2013/048214, filed on Jun. 27, 2013.

(51) Int. Cl.

| | |
|---|---|
| *B29C 69/00* | (2006.01) |
| *B41J 2/155* | (2006.01) |
| *H05K 1/18* | (2006.01) |
| *H05K 3/28* | (2006.01) |
| *H05K 3/32* | (2006.01) |
| *H05K 3/40* | (2006.01) |

(52) U.S. Cl.
CPC ......... *B41J 2/14016* (2013.01); *B41J 2/1433* (2013.01); *B41J 2/14072* (2013.01); *B41J 2/14145* (2013.01); *B41J 2/14201* (2013.01); *B41J 2/155* (2013.01); *B41J 2/1601* (2013.01); *B41J 2/162* (2013.01); *B41J 2/1603* (2013.01); *B41J 2/1607* (2013.01); *B41J 2/1623* (2013.01); *B41J 2/1628* (2013.01); *B41J 2/1632* (2013.01); *B41J 2/1645* (2013.01); *H05K 1/186* (2013.01); *H05K 3/284* (2013.01); *H05K 3/32* (2013.01); *B41J 2002/14411* (2013.01); *B41J 2002/14419* (2013.01); *B41J 2002/14491* (2013.01); *B41J 2202/19* (2013.01); *B41J 2202/20* (2013.01); *H05K 3/4007* (2013.01); *H05K 2203/0228* (2013.01); *H05K 2203/1316* (2013.01)

(58) Field of Classification Search
CPC .......... B41J 2/14072; B41J 2002/14419; B41J 2002/14491; B41J 2002/14411; B41J 2202/19; B41J 2202/20; B29C 69/001; H05K 1/186; H05K 3/284; H05K 3/32; H05K 2203/1316; H05K 3/4007; H05K 2203/0228

See application file for complete search history.

(56) References Cited

U.S. PATENT DOCUMENTS

| | | |
|---|---|---|
| 2008/0149024 A1 | 6/2008 | Petruchik et al. |
| 2011/0037808 A1 | 2/2011 | Ciminelli et al. |
| 2011/0069110 A1 | 3/2011 | Matsumoto et al. |
| 2013/0038664 A1 | 2/2013 | Kagata et al. |
| 2013/0193105 A1 | 8/2013 | Ciminelli et al. |
| 2013/0215197 A1 | 8/2013 | Hays et al. |
| 2013/0342607 A1 | 12/2013 | Sung et al. |

FOREIGN PATENT DOCUMENTS

| | | |
|---|---|---|
| JP | 2002079675 | 3/2002 |
| JP | 2008238485 | 10/2008 |
| JP | 2013076082 | 4/2013 |
| KR | 10-0818277 | 3/2008 |
| WO | WO-2015116027 A1 | 8/2015 |

\* cited by examiner

PROCESS FOR MAKING A MOLDED DEVICE ASSEMBLY AND PRINTHEAD ASSEMBLY

CROSS REFERENCE TO RELATED APPLICATIONS

This is a continuation of U.S. application Ser. No. 15/308,562 filed Nov. 2, 2016 which is itself a 35 U.S.C. 371 national stage filing of international application serial no. PCT/US2014/037669 filed May 12, 2014 which claims priority to international application serial no. PCT/US2013/048214 filed Jun. 27, 2013, each of which applications is incorporated herein by reference in its entirety.

BACKGROUND

Each printhead die in an inkjet pen or print bar includes tiny passages that carry ink or other printing fluid to the ejection chambers. Printing fluid is distributed to the die passages through channels in a structure that supports the printhead dies on the pen or print bar. It may be desirable to shrink the size of each printhead die, for example to reduce the cost of the die and, accordingly, to reduce the cost of the pen or print bar.

DRAWINGS

The same part numbers designate the same or similar parts throughout the figures. The figures are not necessarily to scale. The size of some parts is exaggerated to more clearly illustrate the example shown.

DESCRIPTION

Inkjet printers that utilize a substrate wide printhead assembly, often called a "print bar", have been developed to help increase printing speeds and reduce printing costs. Conventional print bars include multiple parts that carry printing fluid from the printing fluid supplies to the small printhead dies from which the printing fluid is ejected on to the paper or other print substrate. While reducing the size and spacing of the printhead dies continues to be important for reducing cost, channeling printing fluid from the larger supply components to ever smaller, more tightly spaced dies requires complex flow structures and fabrication processes that can actually increase cost.

A new fabrication process has been developed to enable the use of smaller printhead dies and more compact die circuitry to help reduce cost in substrate wide inkjet printer print bars. In one example of the new process, printhead die slivers are arranged on the front part of a printed circuit board (PCB) in the desired configuration and electrically connected to circuitry in the PCB, for example with wire bonds. Then, a cover molding is molded on the PCB surrounding the die slivers, leaving the fluid ejection nozzles exposed on each sliver. Fluid delivery channels are cut into the back part of the PCB to connect to fluid passages in each sliver. The fluid passages in each die sliver may be left unopened during sliver fabrication to simplify the sliver fabrication process and to make the slivers more robust for subsequent handling. The fluid passages in the die slivers are opened at the same time the fluid delivery channels are cut into the PCB by cutting through the PCB and into the back part of each sliver.

The resulting structure includes multiple printhead die slivers embedded in a molding on the front of the PCB, with the printhead nozzles exposed for dispensing printing fluid, and with channels through the back of the PCB to supply printing fluid directly to the passages in each die sliver. The printed circuit board in effect grows the size of each die sliver for making fluid and electrical connections, thus enabling the use of smaller slivers. The ease with which printed circuit boards can be fabricated and processed helps simplify the fabrication of the printhead assemblies. Also, the molding may be used to shape the face of the printhead assembly, for example with bumps to guard against a paper crashing into the exposed nozzle plate and/or with grooves to help control any ink that might accumulate around the nozzles.

The new fabrication process and fluid dispensing structure are not limited to print bars or other types of printhead assemblies for inkjet printing, but may be implemented in other devices and for other fluid flow applications including, for example, additive manufacturing machines and digital titration and other such pharmaceutical dispensing devices. The examples shown in the figures and described herein illustrate but do not limit the invention, which is defined in the Claims following this Description.

As used in this document, a "micro device" means a device having one or more exterior dimensions less than or equal to 30 mm; "thin" means a thickness less than or equal to 650 µm; a "sliver" means a thin micro device having a ratio of length to width (L/W) of at least three; a "printhead die" means that part of an inkjet printer or other inkjet type dispenser to dispense fluid from one or more openings. A "printhead die" is not limited to printing with ink and other printing fluids but also include inkjet type dispensing of other fluids and/or for uses other than printing.

Figure 1:
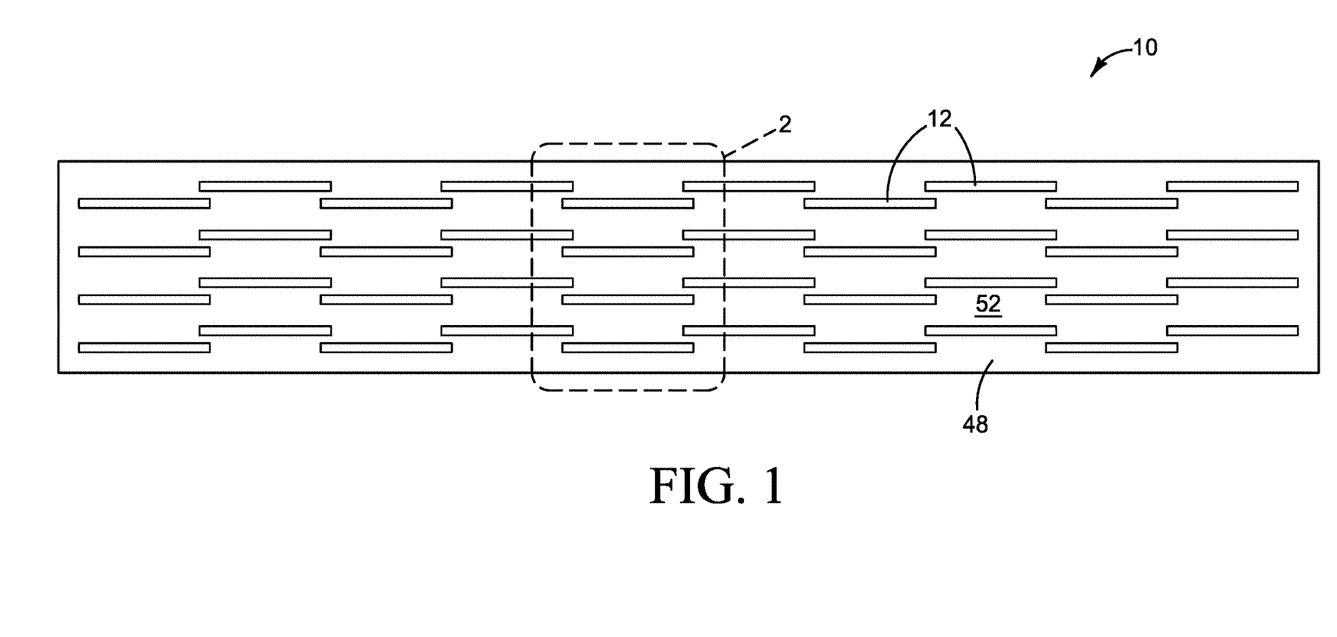
FIG. 1 illustrates one example of a new molded inkjet printhead assembly such as might be used in a pen or print bar in an inkjet printer.
Figure 2:
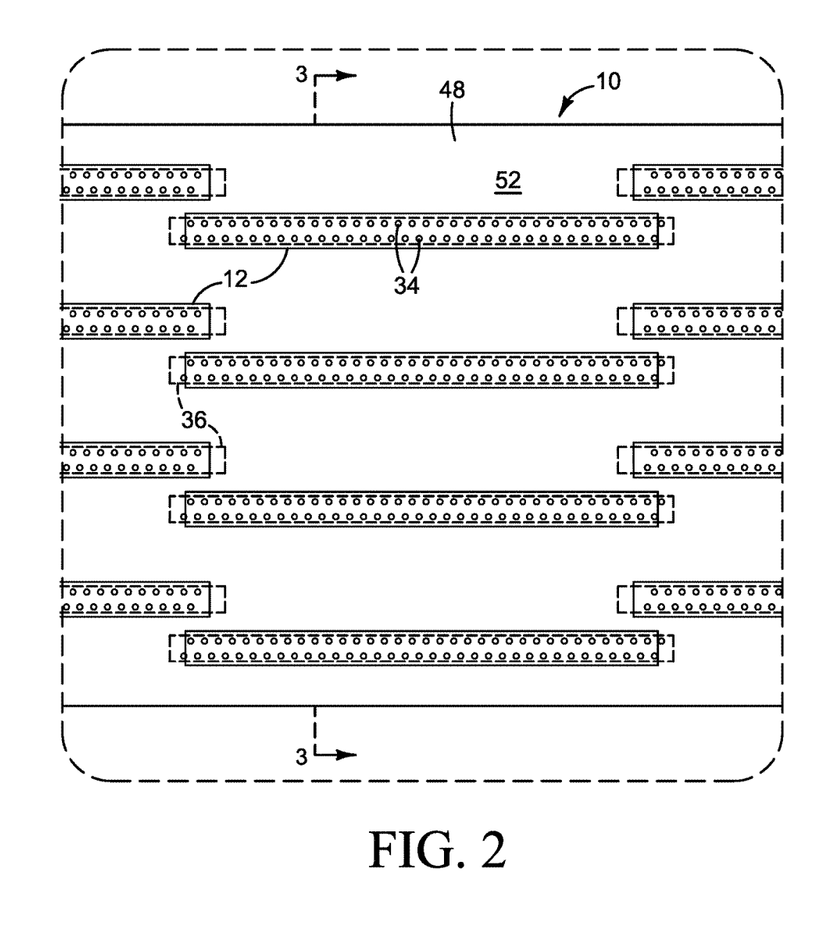
FIG. 2 is a detail from FIG. 1.
Figure 3:
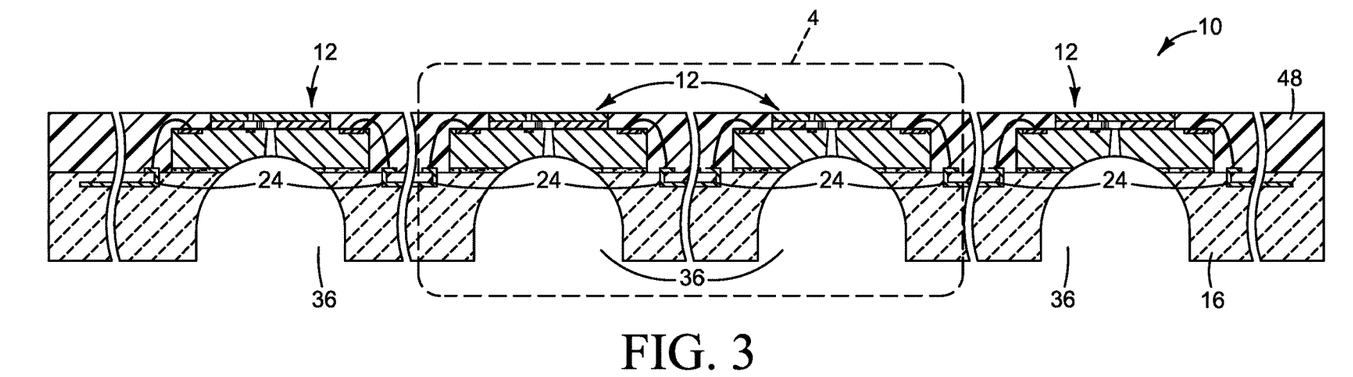
FIG. 3 is a section viewed along the line 3-3 in FIG. 2.
Figure 4:
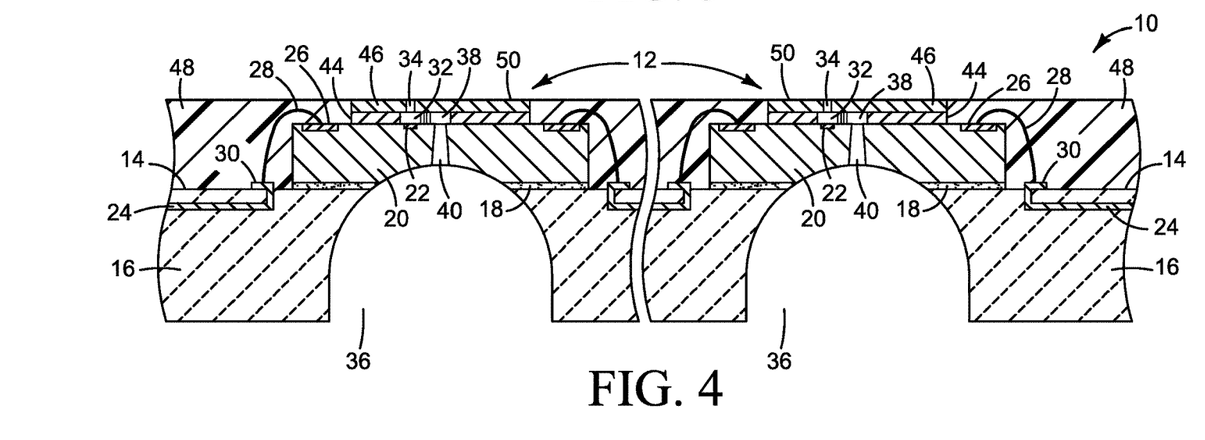
FIG. 4 is a detail from FIG. 3.

FIGS. 1-5 illustrate a printhead assembly 10 with four rows of printhead die slivers 12 arranged generally end to end in a staggered configuration in which each die sliver 12 overlaps another die sliver 12, such as might be used in a substrate wide print bar for an inkjet printer dispensing four colors of ink. Other suitable configurations are possible. For example, printhead dies 12 larger than slivers could be used, with more or fewer dies and/or in a different configuration. As best seen in FIGS. 3 and 4, dies 12 are mounted to the front surface 14 of a printed circuit board (PCB) 16, for example with an adhesive 18. An inkjet printhead die 12 is a typically complex IC (integrated circuit) structure formed on a silicon substrate 20. Thermal, piezoelectric or other suitable fluid ejector elements 22 and other components (not shown) in each printhead IC structure are connected to PCB circuitry 24 through bond pads or other suitable electrical terminals 26 on each die 12. In the example shown, bond wires or other suitable conductors 28 connect die bond pads 26 to bond pads or other suitable terminals 30 on PCB 16.

Figure 5:
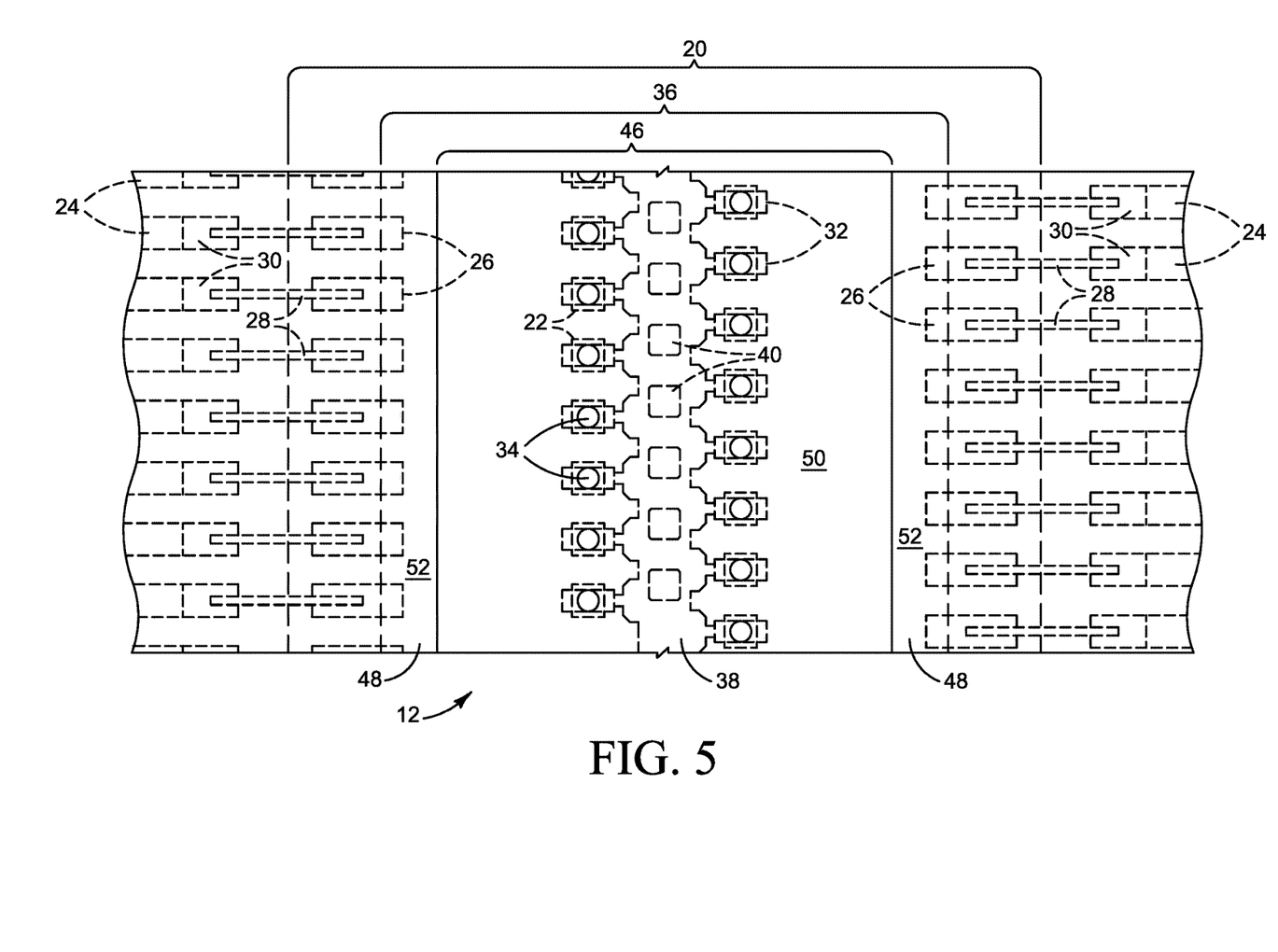
FIG. 5 is a plan view detail showing a portion of one of the printhead dies in the printhead assembly illustrated in FIGS. 1-4.

Referring now specifically to FIGS. 3-5, in the example shown each printhead die 12 includes two rows of ejection chambers 32 and corresponding nozzles 34 through which ink or other printing fluid is ejected from chambers 32. A channel 36 in PCB 16 supplies printing fluid to a corresponding one of the printhead dies 12. Other suitable configurations for printhead dies 12 and channels 36 are possible. For example, more or fewer ejection chambers 32 and/or channels 36 could be used. Printing fluid flows into each ejection chamber 32 from a manifold 38 extending lengthwise along each die 12 between the two rows of ejection chambers 32. Printing fluid feeds into manifold 38 through flow passages 40 connected to printing fluid supply channel 36 at a back part 42 of each die 12.

Printhead assembly 10 is shown face-up in FIGS. 1-5 to more clearly show some features of the assembly. A printhead assembly 10 usually would be oriented face-down when installed in a printer. Also, the idealized representation of a printhead die 12 in FIGS. 3-5 depicts three layers (substrate 20, chamber layer 44, and nozzle plate 46) for convenience only to clearly show ejection chambers 32, nozzles 34, manifold 38, and passages 40. An actual inkjet printhead die 12 may include fewer or more layers than those shown and/or different paths for supplying fluid to chambers 32. For example, a single passage may be used in place of multiple passages 40 with or without a manifold 38.

Referring to FIGS. 1-5, a molding 48 covers the front surface of PCB 16 surrounding dies 12 and encapsulating bond wires 28, leaving an exposed front face 50 of each die 12 at fluid dispensing nozzles 34. In the example shown, molding 48 covers a portion of die substrate 20 that extends past nozzle plate 46 as well as the full expanse of PCB front surface 14. While the front face 52 of cover molding 48 is completely flat in the example shown in FIGS. 1-5, other surface configurations for molding 48 are possible.

Figure 6:
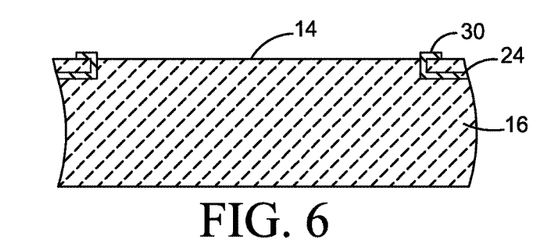
FIGS. 6-11 are a sequence of section views illustrating one example of a process for making a printhead assembly such as the assembly shown in FIGS. 1-5.
Figure 7:
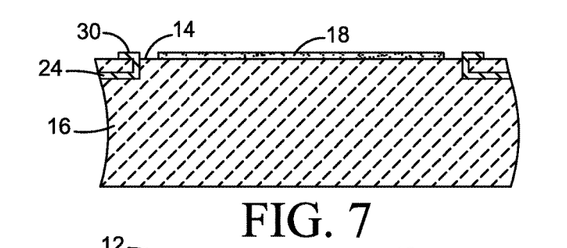
Figure 8:
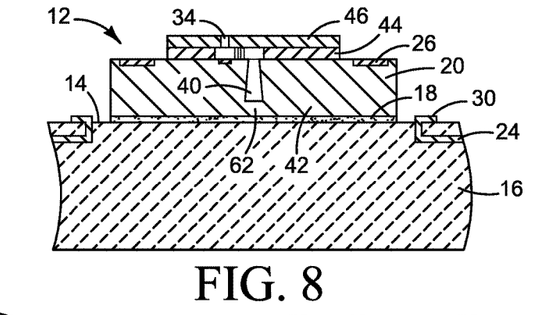
Figure 9:
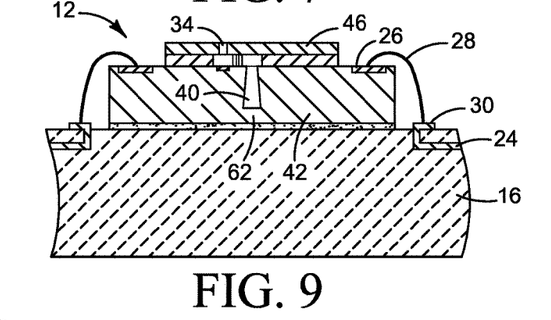
Figure 10:
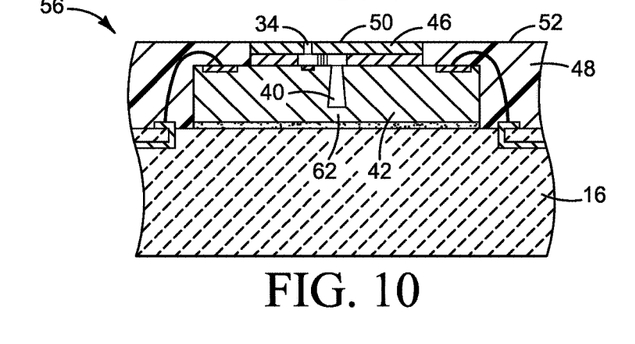
Figure 11:
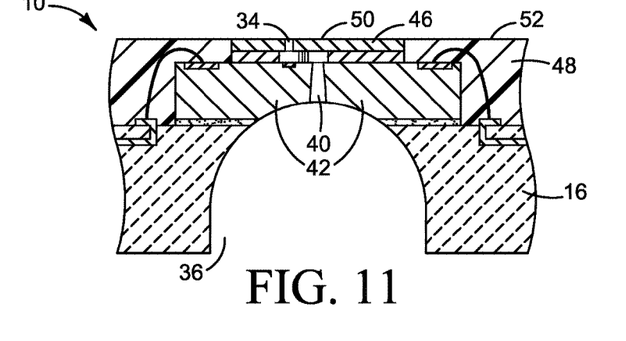
Figure 12:
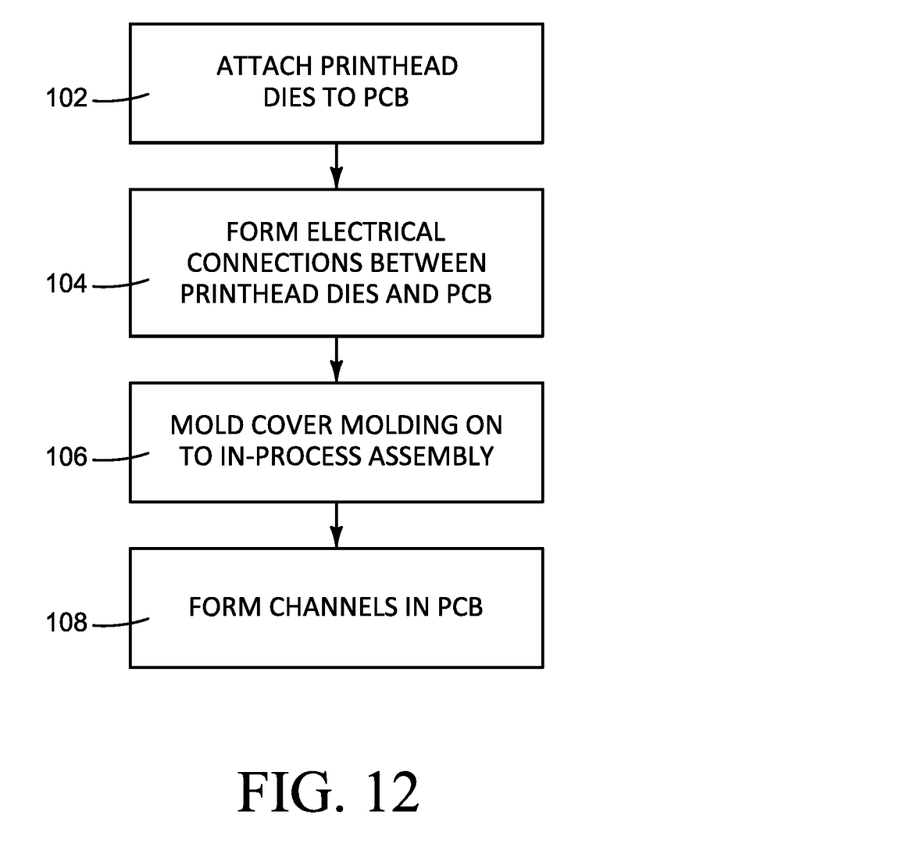
FIG. 12 is a flow diagram illustrating the process shown in FIGS. 6-11.

FIGS. 6-11 are a sequence of section views illustrating one example of a process for making a printhead assembly 10. FIG. 12 is a flow diagram for the process shown in FIGS. 6-11. While only one printhead die 12 is shown in the partial section views for the sequence of FIGS. 6-11, the process steps are applied simultaneously to assemble and mold all dies 12 for a printhead assembly 10 like that shown in FIGS. 1-5. As shown in FIGS. 6-8, individual printhead dies 12 are attached to a PCB 16 pre-fabricated with the desired structural and electronic characteristics to support printhead dies 12 (step 102 in FIG. 12), for example using a patterned adhesive 18 applied to PCB 16. Any suitable technique may be used to apply and pattern adhesive 18 including, for example, adhesive film and paste delivery systems commonly used in IC device fabrication and packaging. Wire bond or other electrical connections are formed between dies 12 and PCB 16, as shown in FIG. 9 (step 104 in FIG. 12) Cover molding 48 is molded on to the in-process assembly of FIG. 9, as shown in FIG. 10 (step 106 in FIG. 12). Channels 36 are formed in PCB 16 in FIG. 11 (step 108 in FIG. 12).

Figure 13:
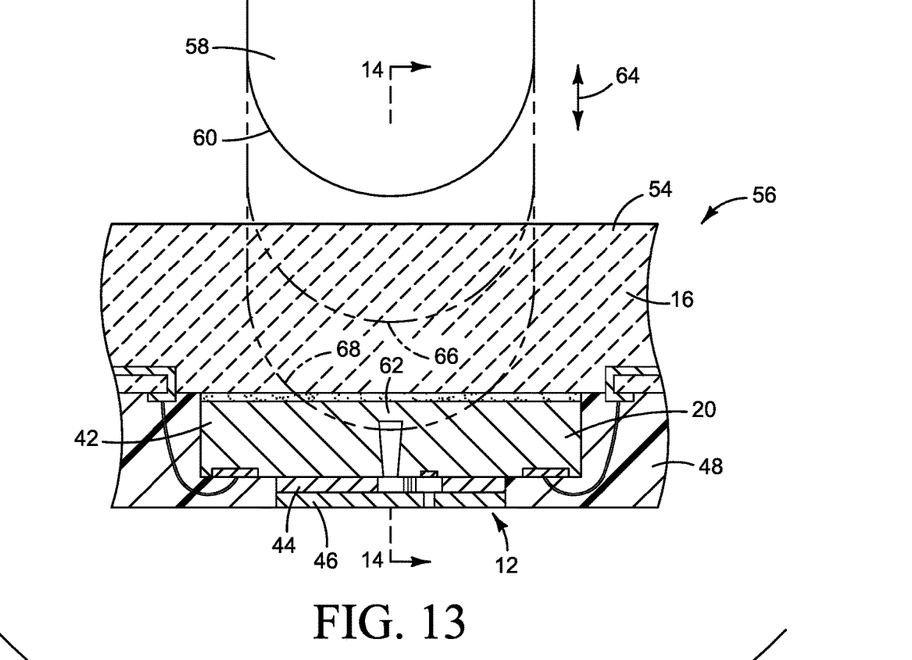
FIGS. 13 and 14 are section views illustrating one example of the channel forming step in the process of FIG. 12.
Figure 14:
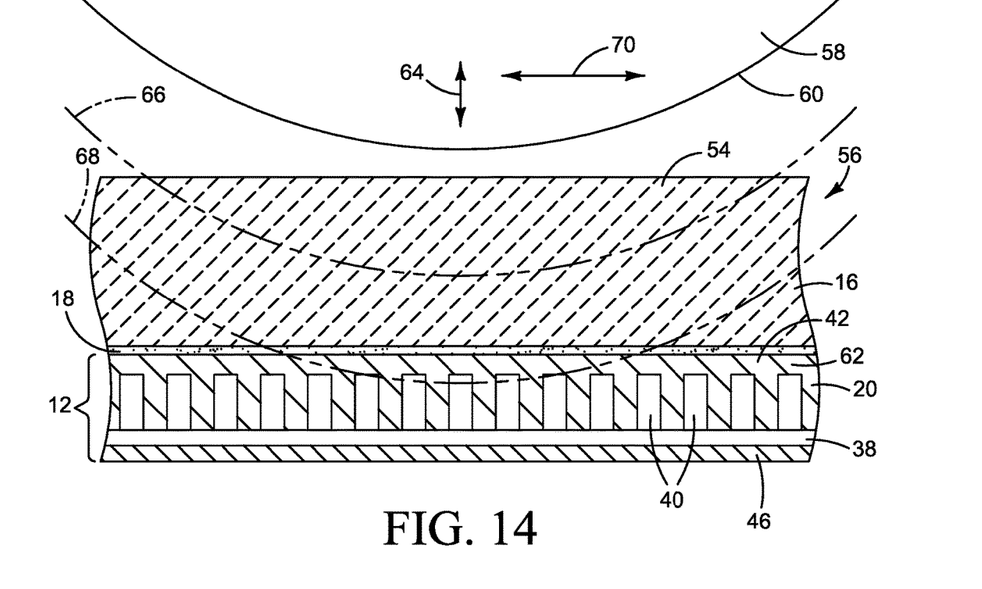

In the example shown in FIGS. 13 and 14, channels 36 are formed by sawing through the back part 54 of PCB 16 and into the back part 42 of dies 12 to open flow passages 40. Referring to FIGS. 13 and 14, the in-process molded assembly 56 is held in a fixed position while a saw blade 58 begins cutting through the back part of 54 of PCB 16 at the location of a channel 36. In this example, fluid flow passages 40 in die substrate 20 are left unopened during the fabrication of printhead dies 12 to simplify the die fabrication process and to make dies 12 more robust for handling, including placement on PCB 16. Saw blade 58 in FIGS. 13 and 14 represents any suitable cutting blade including, for example, a toothed saw blade or an abrasive cutting wheel. Also, in the example shown, the peripheral cutting edge 60 of saw blade 58 has a arcuate profile. Other suitable edge profiles are possible including, for example, flat and tapered profiles.

Saw blade 58 is moved into the back part 54 of PCB 16 and continuing into the back part 42 of die 12 to form channel 36, and remove the "cap" 62 covering flow passages 40, as indicated by direction arrows 64 and dashed lines 66, 68 in FIGS. 13 and 14. Saw blade 58 is moved lengthwise along PCB 16 at the desired depth to cut channel 36 and open passages 40, as indicated by direction arrow 70 in FIG. 14, to form a single uninterrupted channel profile that extends through the back part 54 of PCB 16 and into the back part 42 of die 12 to passages 40. As best seen in FIG. 2, a series of discrete channels 36 are cut into PCB 16. Accordingly, each channel 36 is cut by plunging saw blade 58 into the back part of PCB 16 and continuing into the back part 42 of die 12 for each channel 36.

Figure 15:
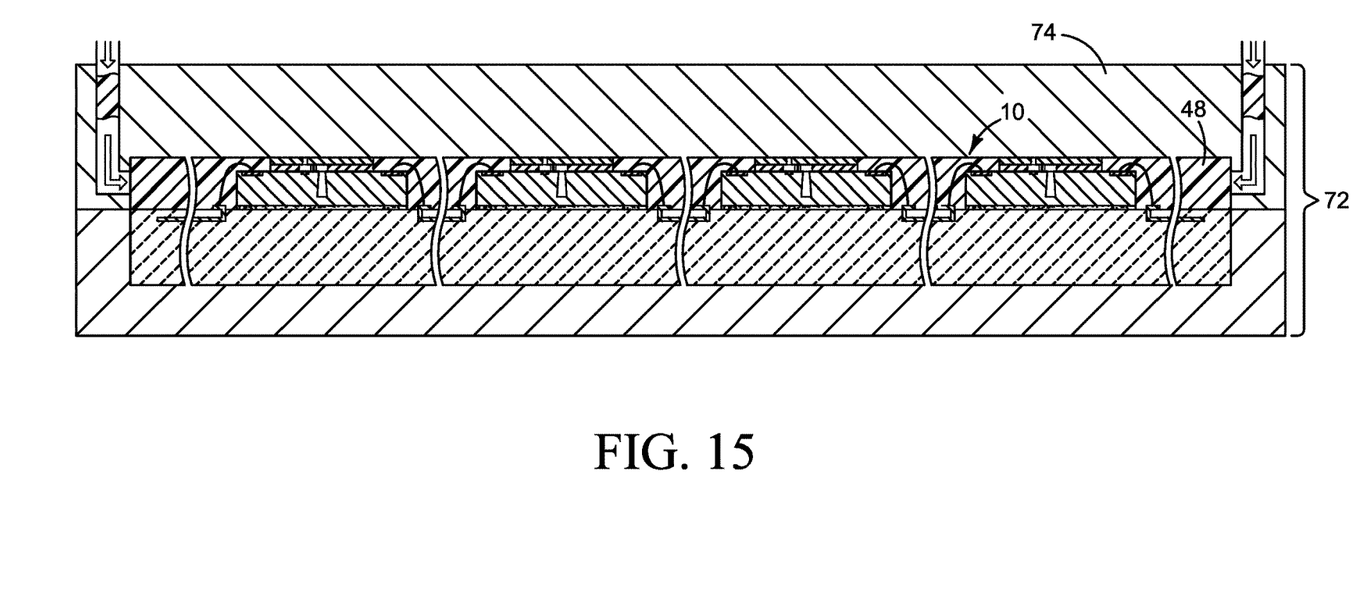
FIG. 15 is a section view illustrating one example of the molding step in the process of FIG. 12.
Figure 16:
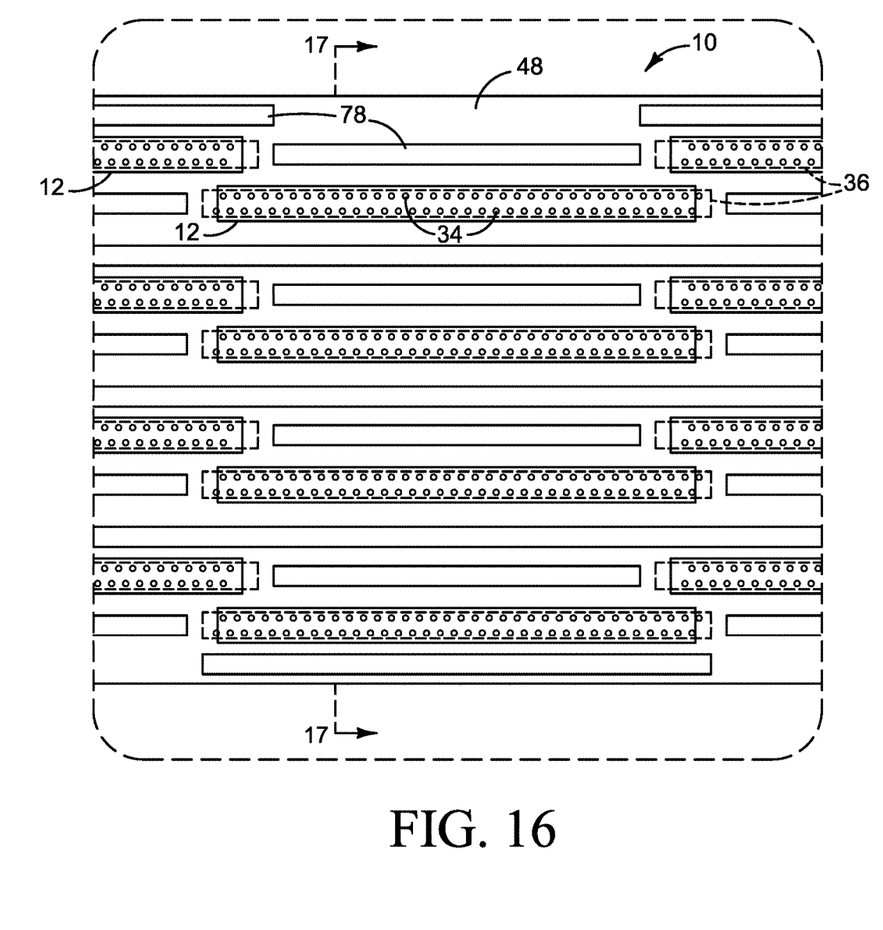
FIGS. 16-18 show one example in which the cover molding includes grooves along each printhead die.
Figure 17:
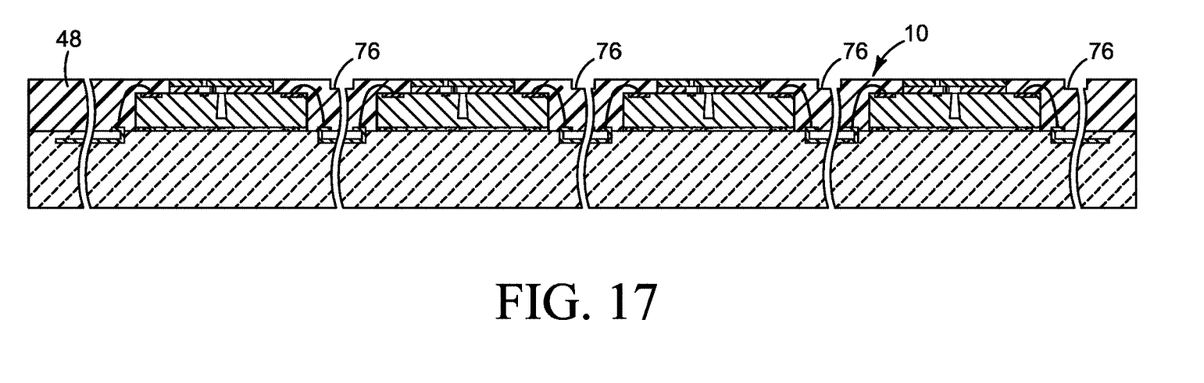
Figure 18:
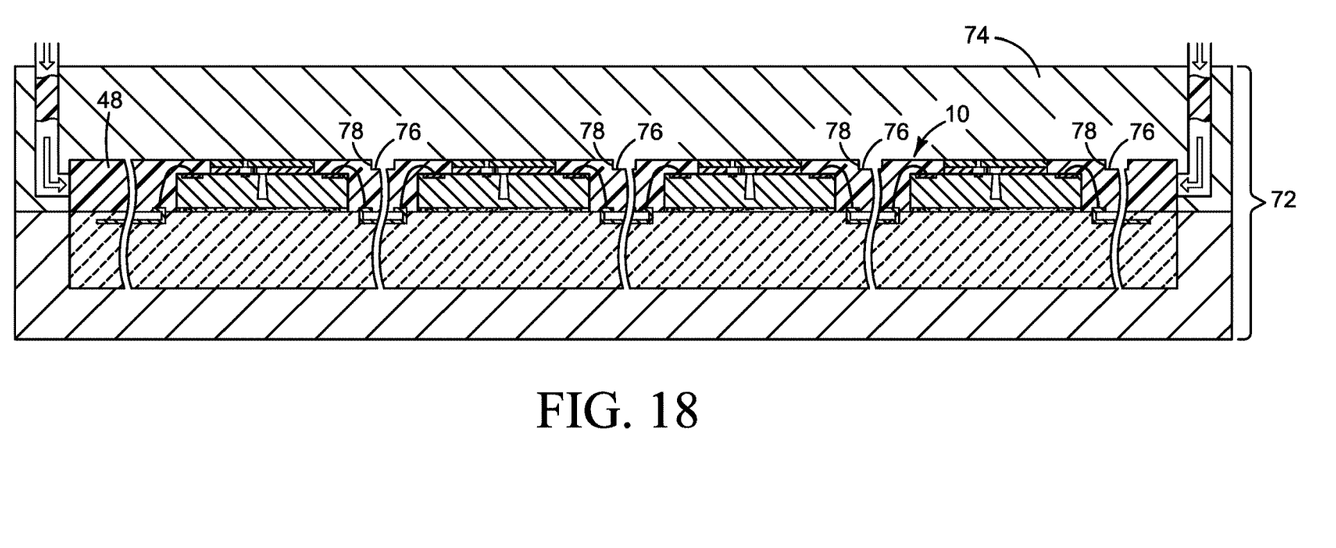
Figure 19:
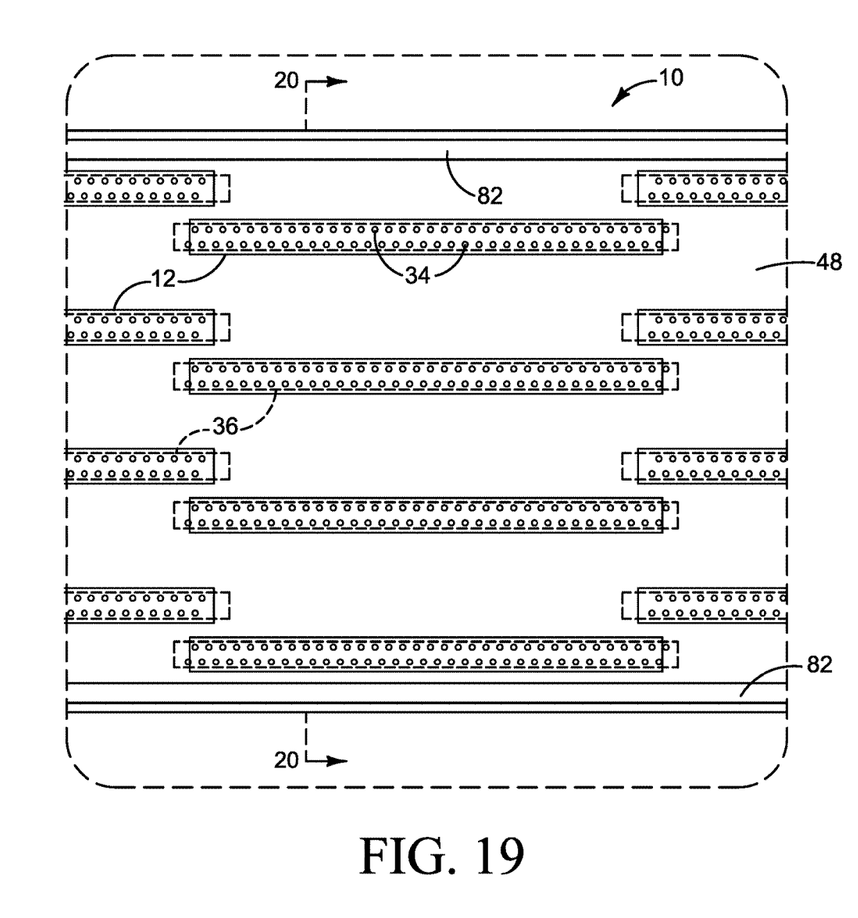
FIGS. 19-21 show one example in which the cover molding includes ridges along one side of the printhead dies.
Figure 20:
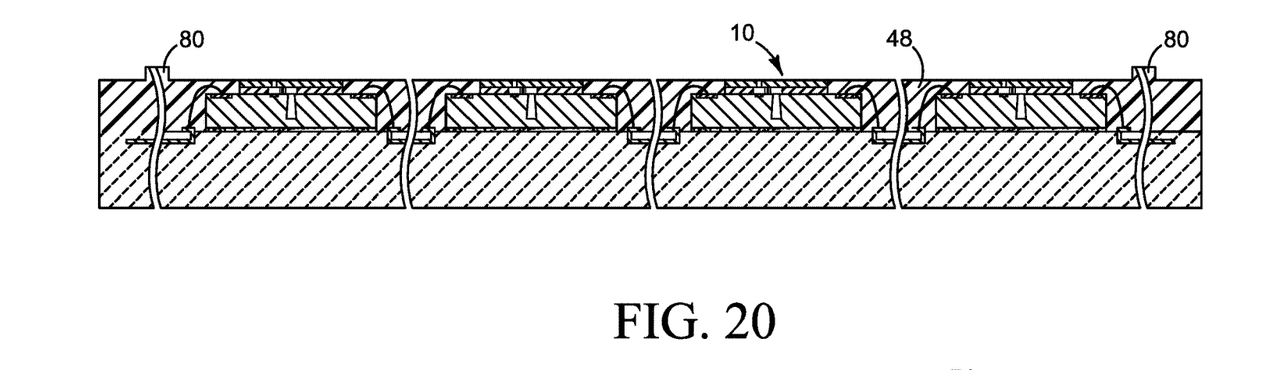
Figure 21:
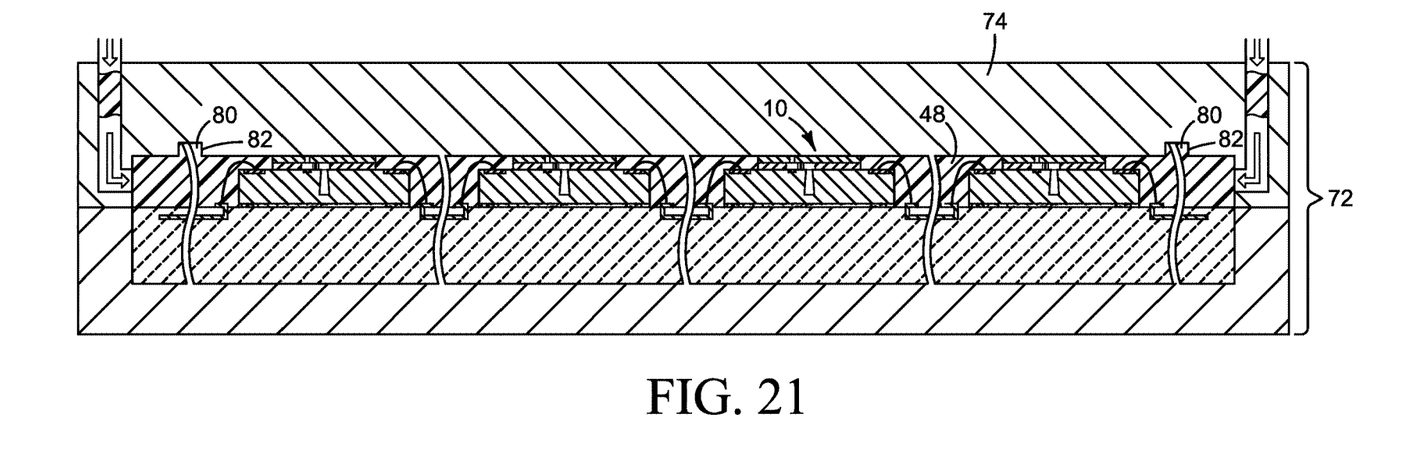

Any suitable molding technique may be used to form molding 48. In one example, shown in FIG. 15, a transfer mold 72 is used to form molding 48. In this example, the top mold chase 74 cavity is configured to form a cover molding 48 like that shown in FIG. 3 in which molding 48 is completely flat across the full width of printhead assembly 10. In another example, shown in FIGS. 16-18, the top mold chase 74 cavity includes bumps 78 to form a cover molding 48 with recesses 76, for example to help control any ink that might accumulate around nozzles 34. In another example, shown in FIGS. 19-21, the top mold chase 74 cavity includes recesses 82 to form bumps 80 in cover molding 48, for example to guard against paper crashing into the exposed nozzles 34. Thus, by changing the configuration of the mold chase cavity, the topology of cover molding 48 may be varied to achieve the desired characteristics of the exposed surface profile of printhead assembly 10.

As noted at the beginning of this Description, the examples shown in the figures and described above illustrate but do not limit the invention. Other examples are possible. Therefore, the foregoing description should not be construed to limit the scope of the invention, which is defined in the following claims.

What is claimed is:

1. A process for making a micro device assembly, comprising:
   placing a micro device on a front part of a printed circuit board;
   molding a molding on the printed circuit board surrounding the micro device; and then
   in a single operation, forming a channel to the micro device in a back part of the printed circuit board and opening a fluid passage in the micro device to the channel.

2. The process of claim 1, wherein forming a channel in the printed circuit board and opening a fluid passage in the micro device in a single operation includes cutting through the back part of the printed circuit board and into the micro device.

3. The process of claim 2, wherein the cutting includes sawing through the back part of the printed circuit board and into the micro device.

4. The process of claim 3, wherein the sawing includes plunging a saw blade through the back part of the printed circuit board and into the micro device.

5. The process of claim 4, wherein the molding includes molding a single monolithic molding on the printed circuit board and over the micro device.

6. The process of claim 5, wherein the molding includes molding the single monolithic molding over part of the micro device.

7. A process for making a printhead assembly, comprising:
arranging printhead dies on a front face of a printed circuit board;
electrically connecting the dies to the printed circuit board;
molding a single cover on the printed circuit board surrounding exposed fluid dispensing nozzles on each die; and then
forming channels to the dies in a back part of the printed circuit board and opening a fluid passage in each die simultaneously with forming a corresponding channel in the printed circuit board.

8. The process of claim 7, wherein the forming and the opening include sawing through the back part of the printed circuit board to form the channels and into the dies to open the fluid passages.

9. The process of claim 8, wherein the sawing includes plunging a saw blade through the back part of the printed circuit board and into the dies.

10. The process of claim 7, wherein the molding includes molding recesses in the cover molding, or molding bumps in the cover molding, or molding recesses and bumps in the cover molding.

11. The process of claim 7, wherein:
the electrically connecting includes wire bonding terminals on the dies to terminals on the printed circuit board; and
the molding includes molding a cover on the printed circuit board surrounding exposed fluid dispensing nozzles on each die and completely covering the wire bonds.

12. A printhead assembly, comprising:
a printed circuit board;
a printhead die sliver mounted to a front part of the printed circuit board, the die sliver having fluid ejectors, fluid chambers each near an ejector, passages in a back part of the die through which fluid may flow to the chambers, and nozzles at a front part of the die sliver through which fluid may be ejected from the chambers;
a molding covering the printed circuit board and surrounding the nozzles at the front part of the die sliver; and
a single channel that extends through the back part of the printed circuit board and into the back part of the die sliver to the passages in the die sliver.

13. The printhead assembly of claim 12, wherein:
the printhead die sliver includes multiple printhead die slivers each mounted to a front part of the printed circuit board and each having fluid ejectors, fluid chambers each near an ejector, passages in a back part of the die sliver through which fluid may flow to the chambers, and nozzles at a front part of the die sliver through which fluid may be ejected from the chambers;
the molding is a single monolithic molding covering the printed circuit board and surrounding the nozzles at the front part of each of the die slivers; and
the single channel includes multiple single channels each extending through the back part of the printed circuit board and into the back part of a corresponding one of the die slivers to the passages in the die sliver.

14. The printhead assembly of claim 13, wherein the die slivers are arranged generally end to end along a length of the printhead in a staggered configuration in which each die sliver overlaps another die sliver.

15. The process of claim 1, wherein:
placing a micro device on a front part of a printed circuit board comprises placing a single printhead die on the front part of the printer circuit board;
molding a molding on the printed circuit board surrounding the micro device comprises molding a molding on the printed circuit board surrounding the single die and over part of the single die; and
forming a channel to the micro device in a back part of the printed circuit board and opening a fluid passage in the micro device to the channel in a single operation comprises forming a channel to the single die in the back part of the printed circuit board and opening a fluid passage in the single die in a single operation.

16. The process of claim 1, wherein:
placing a micro device on a front part of a printed circuit board comprises placing multiple printhead dies on the front part of the printed circuit board in a staggered configuration in which each die overlaps another die;
molding a molding on the printed circuit board surrounding the micro device comprises molding a molding on the printed circuit board surrounding each die and over part of the each die; and
forming a channel to the micro device in a back part of the printed circuit board and opening a fluid passage in the micro device to the channel in a single operation comprises, in one single operation or in each of multiple single operations, forming multiple channels in a back part of the printed circuit board each to a corresponding one or more of the dies and opening a fluid passage in each die to the corresponding channel.

* * * * *